United States Patent
Maeda (10) Patent No.: US 8,185,339 B2
(45) Date of Patent: May 22, 2012

(54) TEST METHOD AND PROGRAM PRODUCT USED THEREFOR

(75) Inventor: Hironori Maeda, Tatebayashi (JP)

(73) Assignee: Advantest Corporation, Tokyo (JP)

( * ) Notice: Subject to any disclaimer, the term of this patent is extended or adjusted under 35 U.S.C. 154(b) by 538 days.

(21) Appl. No.: 12/324,096

(22) Filed: Nov. 26, 2008

(65) Prior Publication Data

US 2010/0131224 A1 May 27, 2010

(51) Int. Cl.
*G01R 31/00* (2006.01)
*G01R 31/14* (2006.01)
*G06F 19/00* (2011.01)

(52) U.S. Cl. ........ 702/123; 702/117; 702/118; 702/119; 702/120

(58) Field of Classification Search ............... 702/117, 702/118, 119, 120, 123
See application file for complete search history.

(56) References Cited

U.S. PATENT DOCUMENTS

2007/0007981 A1* 1/2007 Golan .................... 324/765
2007/0165469 A1* 7/2007 Rehm et al. ............ 365/201

FOREIGN PATENT DOCUMENTS

JP 2001-043696 A 2/2001
JP 2005-300344 A 10/2005

OTHER PUBLICATIONS

English translation of the International Preliminary Report received in corresponding International application nubmer PCT/JP2009/005596, dated Jul. 5, 2011, 5 pages.

* cited by examiner

*Primary Examiner* — Janet Suglo
(74) *Attorney, Agent, or Firm* — Osha • Liang LLP (57) ABSTRACT

The testing method of the present invention for testing a plurality of devices under test connected to a test module includes (a) determining combinations of devices under test that can theoretically be measured simultaneously from among the combinations of the plurality of devices under test based on at least the connection relationship between the test module and the plurality of devices under test. The testing method further includes (b) testing the plurality of devices under test by sequentially selecting the combinations of devices under test to be actually measured simultaneously from the combinations determined in (a).

4 Claims, 5 Drawing Sheets

|  | DUT | | | | | |
|---|---|---|---|---|---|---|
|  | 1 | 2 | 3 | 4 | 5 | 6 |
| $S_0$ | 1 | 1 | 0 | 0 | 0 | 0 |
| $S_1$ | 0 | 1 | 0 | 1 | 0 | 0 |
| $S_2$ | 1 | 0 | 0 | 0 | 0 | 1 |
| $S_3$ | 0 | 0 | 1 | 1 | 0 | 0 |
| $S_4$ | 0 | 0 | 1 | 0 | 1 | 0 |
| $S_5$ | 0 | 0 | 0 | 1 | 0 | 1 |
| $S_6$ | 0 | 0 | 0 | 0 | 1 | 1 |

FIG.5

| | | DUT | | | | | |
|---|---|---|---|---|---|---|---|
| | | 1 | 2 | 3 | 4 | 5 | 6 |
| DUT | 1 | 1 | 0 | 1 | 1 | 1 | 0 |
| | 2 | 0 | 1 | 1 | 0 | 1 | 1 |
| | 3 | 1 | 1 | 1 | 0 | 0 | 1 |
| | 4 | 1 | 0 | 0 | 1 | 1 | 0 |
| | 5 | 1 | 1 | 0 | 1 | 1 | 0 |
| | 6 | 0 | 1 | 1 | 0 | 0 | 1 |

FIG.6

TEST METHOD AND PROGRAM PRODUCT USED THEREFOR

BACKGROUND

1. Technical Field

The present invention relates to a testing method for an electronic device, such as a semiconductor device, and a program product used therein, and particularly, to a method for testing a plurality of devices under test connected to a test module.

2. Related Art

As a conventional testing method, a method for simultaneously measuring a plurality of devices under test by connecting only one device under test to one segment of a test module is known. In this case, since it is possible to simultaneously control a plurality of segments, a plurality of devices under test can be tested simultaneously via a single measurement. However, only one device under test can be allocated to one segment in this connection relationship, and the number of devices under test capable of being tested per one-time connection is limited.

Conversely, when a user connects two or more devices under test to one segment of a test module to make effective use of the test module's external terminals, the two or more devices under test connected per segment cannot be measured at the same time as one another, thereby requiring that a number of measurements be carried out per test. When a large number of devices under test are connected to the test module in this case, it is difficult for the user to arbitrarily select the sequence in which the devices under test are to be measured, and it is even more difficult to select a sequence that has a minimal number of measurements.

SUMMARY

Accordingly, an object of the present invention is to provide a testing method and program product capable of solving for the above problems. The object will be attained by combining features disclosed in the independent claims of the Claims. The dependent claims will recite more advantageous concrete examples of the present invention.

According to a first aspect of the present invention for achieving the above object, there is provided a testing method for testing a plurality of devices under test connected to a test module, comprising (a) determining combinations of devices under test that can theoretically be measured simultaneously from among the combinations of the plurality of devices under test, based on at least the connection relationship between the test module and the plurality of devices under test, and (b) testing the plurality of devices under test by sequentially selecting the combinations of devices under test to be actually measured simultaneously from the combinations determined in (a).

In the testing method, carrying out (a) and (b) makes it possible to test using the number of measurements that is less than the number of the plurality of devices under test connected to the test module.

In the testing method, the test module has a plurality of segments, and in (a), the combinations of devices under test that are unable to be measured simultaneously can be determined for each of the segments from among the combinations of the plurality of devices under test, and the combinations of devices under test that are theoretically able to be measured simultaneously can be determined based on these combinations.

In (b) of the testing method, the combinations of devices under test to be actually measured simultaneously can be selected in ascending order from the smallest number of devices under test that are able to be measured simultaneously.

In (b) of the testing method, the combinations of devices under test to be actually measured simultaneously can be selected in descending order from the largest number of devices under test that are able to be measured simultaneously.

In (b) of the testing method, the combinations of devices under test to be actually measured simultaneously can be selected in the order of numbers pre-allocated to the devices under test.

According to a second aspect of the present invention, there is provided a program product that is used for testing a plurality of devices under test connected to a test module, this program product causing a computer to execute a process that comprises (a) generating combination data for devices under test that can theoretically be measured simultaneously from among the combinations of the plurality of devices under test, based on at least the connection relationship between the test module and the plurality of devices under test, and (b) testing the plurality of devices under test by sequentially selecting the combinations of devices under test to be actually measured simultaneously from the combination data generated in (a).

DESCRIPTION OF EXEMPLARY EMBODIMENTS

The present invention will be explained below using the embodiments of the invention while referring to the drawings, but the following embodiments do not limit the claimed invention, and not all of the combinations of features explained in the embodiments are required as the solution of the invention.

Figure 1:
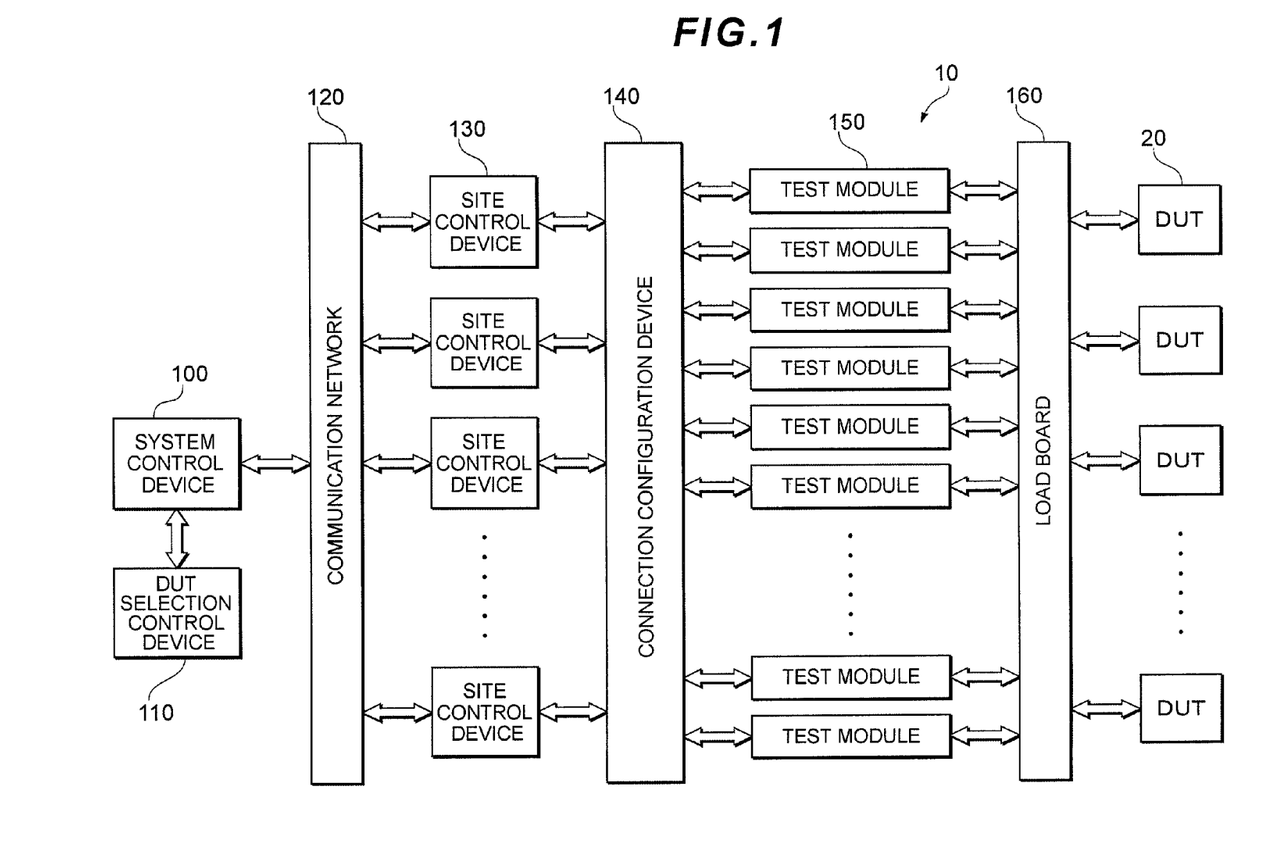
FIG. 1 is a diagram for illustrating a testing method according to an embodiment of the present invention.

FIG. 1 is a diagram for illustrating a testing method related to a first embodiment of the present invention. In this embodiment, a plurality of devices under test (DUT) 20 are tested using the testing apparatus 10 shown in FIG. 1. Specifically, the testing apparatus 10 generates a prescribed test signal, supplies the test signal to a DUT 20, and determines if the DUT 20 is "Pass" or "Fail" based on whether or not a result signal, which outputs the result of the DUT 20 operation on the basis of the test signal, coincides with an expected value. The testing apparatus 10 related to the embodiment is realized in accordance with an open architecture, and an open architecture-based module can be used as the test module 150 that supplies the test signal to the DUT 20.

As shown in FIG. 1, the testing apparatus 10 comprises a system control device 100, DUT selection control device 110, communication network 120, site control device 130, connection configuration device 140, test module 150 and load board 160. A user can arbitrarily combine the site control device 130 and the test module 150 in accordance with the number of DUT 20 external terminals, the DUT 20 configuration, such as the number of functional blocks, and the nature of the test, and make use of this combination via the system control device 100.

The system control device 100 stores a test control program, testing program, and test data, which the testing apparatus 10 uses to test the DUT 20. The system control device 100, for example, can be connected to a plurality of site control devices 130 via the communication network 120, the plurality of site control devices 130, for example, can be connected to a plurality of test modules 150 via the connection configuration device 140, and the plurality of test modules 150, for example, can be connected to a plurality of DUT 20 via the load board 160. Thus, providing a connection configuration device 140 and a load board 160 makes it possible to freely configure and change the interconnection relationships of the site control device 130, test module 150 and DUT 20.

Figure 2:
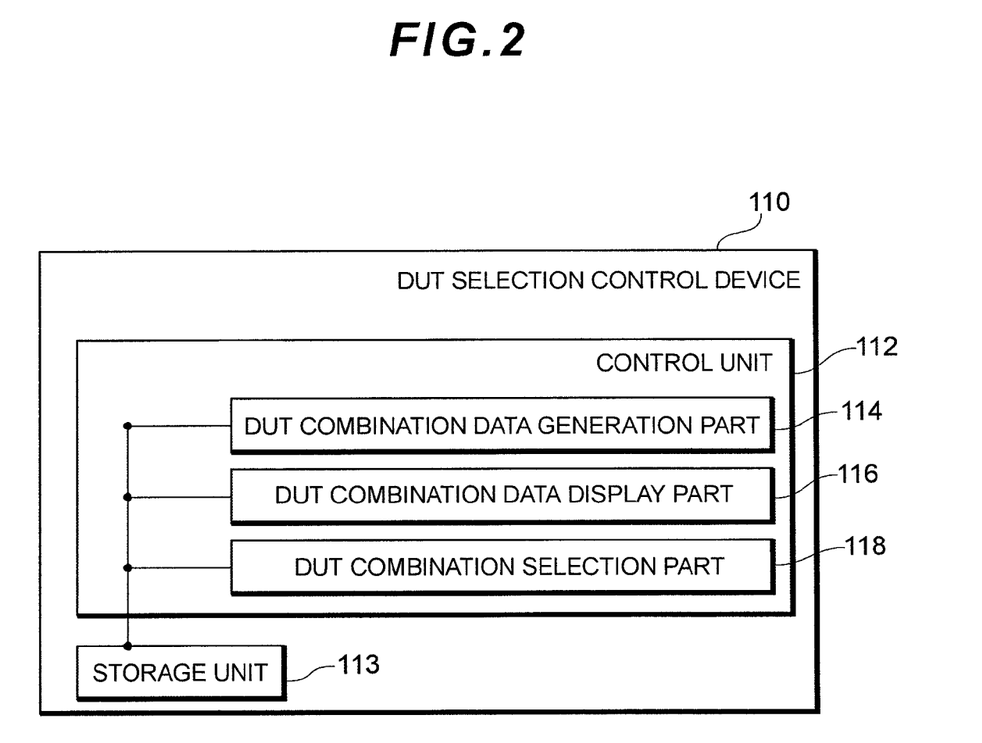
FIG. 2 is a diagram for illustrating a program product according to an embodiment of the present invention.

FIG. 2 is a diagram showing details of a DUT selection control device 110 shown in FIG. 1. The DUT selection control device 110 is a program product in which a prescribed program for carrying out the testing method is pre-installed. The DUT selection control device 110 comprises as a primary constitution a control unit 112 for controlling the processing for testing, and a storage unit 113 for storing the data needed for testing. By executing either a prescribed program that is stored in an external storage device or the like, or a prescribed program that is capable of being downloaded via a communication network, the DUT selection control device 110 can also cause a testing method, which will be described in detail below, to be executed in the testing apparatus 10. Also, the DUT selection control device 110 can be disposed independently of the system control device 100 as shown in FIG. 1, or can be incorporated as a part of either the system control device 100 or the site control device 130.

The control unit 112 of the DUT selection control device 110 shown in FIG. 2 comprises as a primary constitution a DUT combination data generation part 114 and a DUT combination selection part 118. The DUT selection control device 110 (for example, the control unit 112) can additionally have a DUT combination data display part 116. The respective functional blocks are connected to a storage unit 113, and consequently, the information, which is processed by the above-mentioned respective functional blocks, and which is needed in the testing method, can be either written to the storage unit 113 or read out from the storage unit 113. An explanation of the respective functional blocks can be obtained by referring to the explanation of the testing method provided below.

In the testing method related to this embodiment, a user tests a plurality of DUTs that have been connected to the test module 150 in a prescribed connection relationship. In this case, testing can be carried out using a number of measurements that is less than the number of the plurality of DUTs connected to the test module 150. That is, when n (n being an integer of 2 or greater) DUTs are connected to the test module 150, all of the DUTs can be tested using at the most (n−1) measurements by simultaneously measuring at least two DUTs in a single measurement. The testing method related to this embodiment will be explained in detail by referring to FIGS. 3 through 5. However, the testing method related to this embodiment is not limited to the examples of the constitution of FIGS. 3 through 5.

Figure 3:
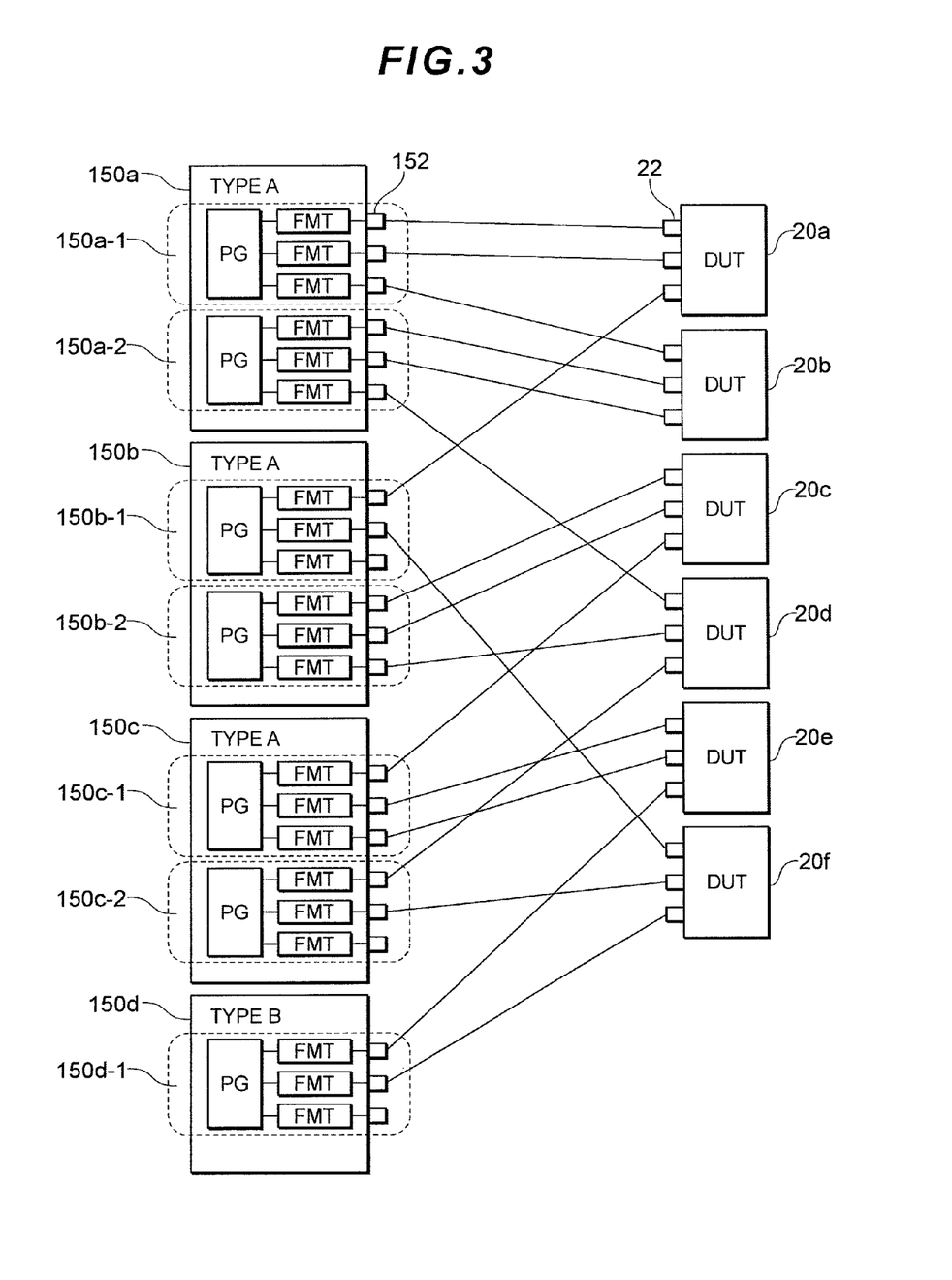
FIG. 3 is a diagram showing an example of a connection relationship between a test module and devices under test according to an embodiment of the present invention.

FIG. 3 is a diagram showing an example of a connection relationship between the test module and the devices under test related to this embodiment. In the example shown in FIG. 3, modules (for example, digital modules) 150a through 150d, which are an example of a test module 150, and a plurality of DUTs 20a through 20f are connected to one another. The modules 150a through 150d each have at least one segment, which is the smallest operating unit, and there is a pattern generator PG and formatter FMT for each segment. The respective modules 150a through 150d also each have a plurality of external terminals 152, and the DUTs 20a through 20f are connected to the test module 150 by these external terminals 152 being connected to the external terminals 22 of the DUTs.

Modules 150a through 150c are the same (Type A), and can be controlled using the same control method. For example, modules 150a through 150c can each be controlled using the same type of synchronized signal. By contrast, module 150d is a different type than modules 150a through 150c (Type B), and can be controlled using a method (for example, a different type of synchronization signal) that differs from that of modules 150a through 150c. The constitutional difference is that modules 150a through 150c each have two segments 150a-1 through 150c-2, and, by contrast, module 150d has one segment 150d-1.

In the example shown in FIG. 3, the respective segments 150a-1 through 150d-1 each have three external terminals 152, and only one DUT external terminal 22 can be connected to one of the external terminals 152. Furthermore, the module-DUT connection relationship is not limited to a configuration in which only one DUT external terminal is able to connect to one module external terminal, and a plurality of external terminals of either the same or different DUTs can connect to one module external terminal, or a plurality of external terminals of either the same or different modules can connect to one DUT external terminal.

Furthermore, the constitution of the module, number of modules, number of module external terminals, number and constitution of module segments, number of DUT external terminals, control method required for a DUT external terminal, and module-DUT connection relationship are not limited to the constitution example of FIG. 3, and can be either set or changed at one's discretion within the scope of common general technical knowledge.

The connection relationship between the modules 150a through 150d and the DUTs 20a through 20f shown in FIG. 3 will be described in detail below. That is, in module 150a, the first through the third external terminals of segment 150a-1 (The first, second and third external terminals in order from the top of FIG. 3. Hereinafter, the same will apply to the other segments or DUTs as well.) are respectively connected to the first and second external terminals of DUT 20a and the first external terminal of DUT 20b, and the first through the third external terminals of segment 150a-2 are connected to the second and third external terminals of DUT 20b, and the first external terminal of DUT 20d. In module 150b, the first and second external terminals of segment 150b-1 are respectively connected to the third external terminal of DUT 20a and the first external terminal of DUT 20f, the third external terminal of segment 150b-1 is not connected to any DUT, and the first through the third external terminals of segment 150b-2 are respectively connected to the first and second external terminals of DUT 20c and the second external terminal of DUT 20d. In module 150c, the first through the third external terminals of segment 150c-1 are respectively connected to the third external terminal of DUT 20c and the first and second external terminals of DUT 20e, the first and second external terminals of segment 150c-2 are respectively connected to the third external terminal of DUT 20d and the second external terminal of DUT 20f, and the third external terminal of segment 150c-2 is not connected to any DUT. In module 150d, the first and second external terminals of segment 150d-1 are respectively connected to the third external terminal of DUT 20e and the third external terminal of DUT 20f, and the third external terminal of segment 150d-1 is not connected to any DUT.

Connecting two or more DUTs to one segment like this can eliminate idle external terminals 152 on the test module 150, and increase the number of DUTs that can be measured simultaneously.

The testing method related to this embodiment first determines the combinations of DUTs that can theoretically be measured simultaneously from among combinations of the plurality of DUTs based on at least the connection relationship between the test module 150 and the plurality of DUTs 20a through 20f.

Figure 4:
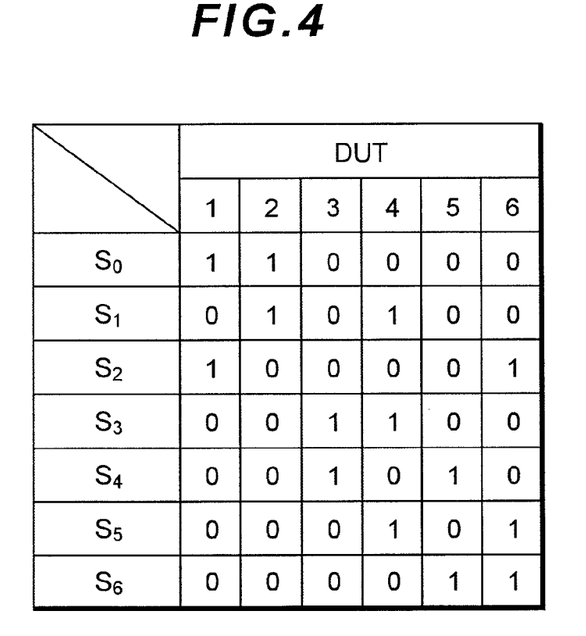
FIG. 4 is a diagram showing the combinations of devices under test that are unable to be measured simultaneously in each segment in the constitution shown in FIG. 3.
Figure 5:
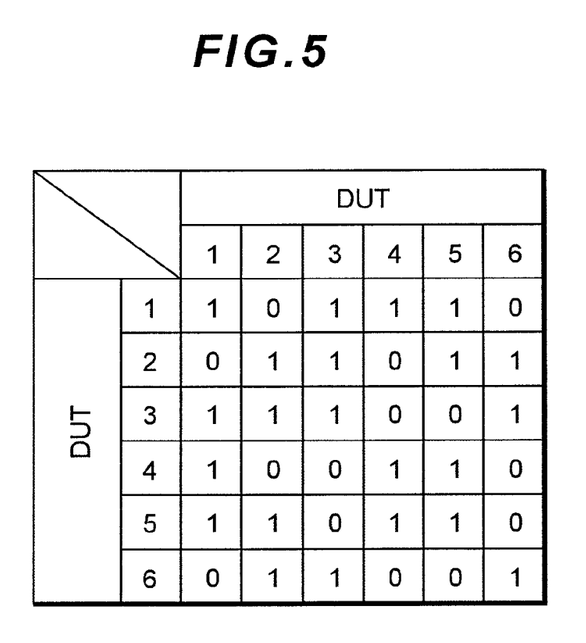
FIG. 5 is a diagram showing combinations of devices under test that can theoretically be measured simultaneously in the constitution shown in FIG. 3.
Figure 6:
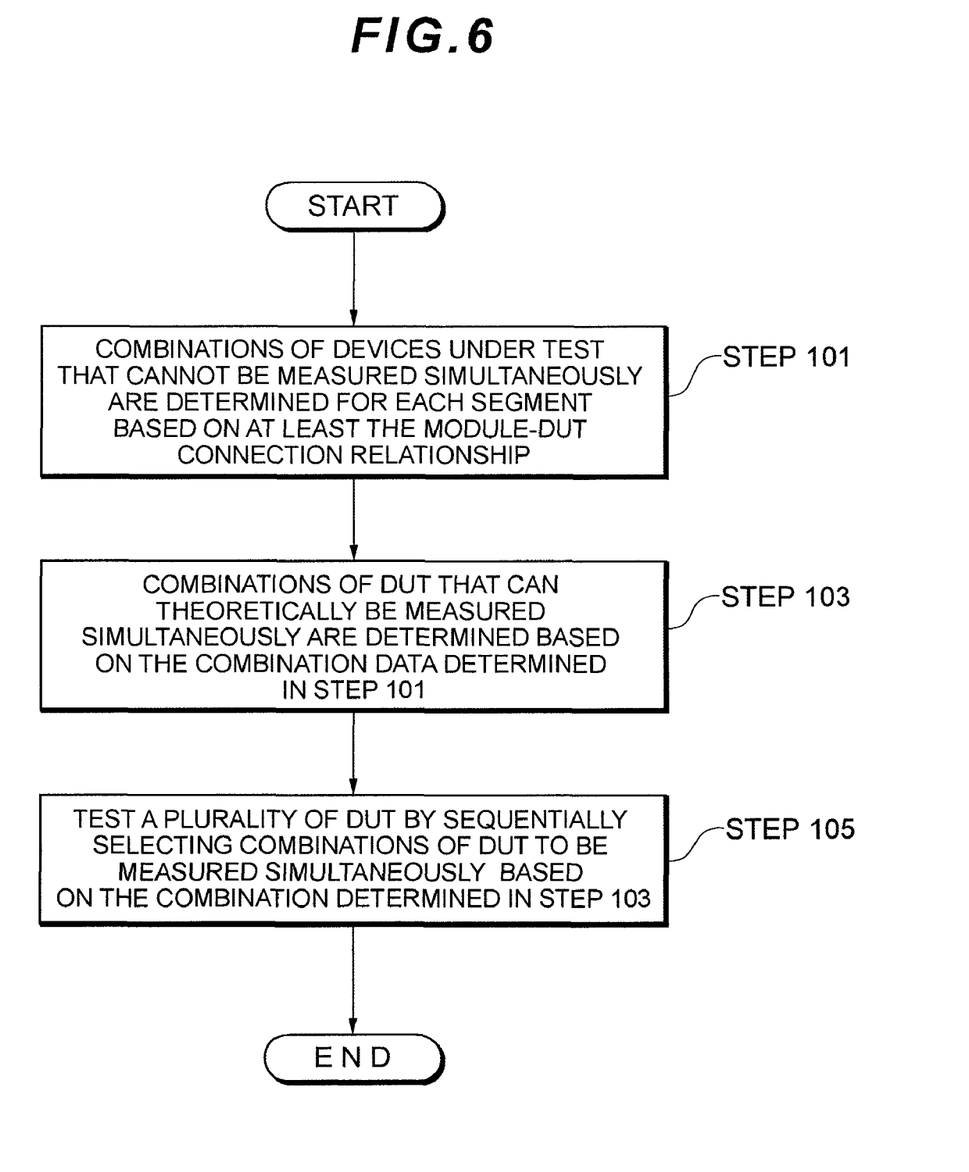
FIG. 6 is a flowchart of the testing method according to an embodiment of the present invention.

FIGS. 4 and 5 here are diagrams illustrating the steps for determining the combinations of devices under test that can theoretically be measured simultaneously in the constitution shown in FIG. 3. Further, FIG. 6 is a flowchart of the testing method related to this embodiment.

First, as shown in FIG. 4, the combinations of devices under test that are able to be measured simultaneously by segment are determined based on at least the connection relationship between the modules 150a through 150d and the DUTs 20a through 20f shown in FIG. 3 (Step 101). In FIG. 4, $S_0$ through $S_6$ respectively correspond to segments 150a-1 through 150d-1 of FIG. 3, and DUTs 1 through 6 correspond to DUTs 20a through 20f of FIG. 3. The "1" displayed in FIG. 4 signifies that simultaneous measurements are not possible, and the "0" signifies that simultaneous measurements are possible. For example, in $S_0$, which corresponds to segment 150a-1, a "1" is displayed in DUT 1 (corresponding to DUT 20a of FIG. 3) and DUT 2 (corresponding to DUT 20b of FIG. 3), denoting that DUTs 1 and 2 cannot be measured simultaneously.

As is clear from the combination data of FIG. 4, combinations that are unable to be measured simultaneously in the connection relationship between the modules and DUTs shown in FIG. 3 are DUTs 1 and 2 in $S_0$, DUTs 2 and 4 in $S_1$, DUTs 1 and 6 in $S_2$, DUTs 3 and 4 in $S_3$, DUTs 3 and 5 in $S_4$, DUTs 4 and 6 in $S_5$, and DUTs 5 and 6 in $S_6$.

Next, the DUT combinations that can theoretically be measured simultaneously are determined based on the combination data of FIG. 4 as shown in FIG. 5 (Step 103). In FIG. 5, DUTs 1 through 6 respectively correspond to DUTs 20a through 20f of FIG. 3. Also, the "1" displayed inside FIG. 5 signifies that simultaneous measurements are possible, and the "0" displayed inside FIG. 5 signifies that simultaneous measurements are not possible. For example, in the DUT 1 row in FIG. 5, "1" is displayed in DUTs 1, 3, 4 and 5, denoting that DUTs 3, 4 and 5 are the other DUTs that can theoretically be measured simultaneously with DUT 1.

As is clear from the combination data of FIG. 5, the DUT combinations that can theoretically be measured simultaneously in the connection relationship between the modules and DUTs shown in FIG. 3 are DUTs 3, 4 and 5 for DUT 1, DUTs 3, 5 and 6 for DUT 2, DUTs 1, 2 and 6 for DUT 3, DUTs 1 and 5 for DUT 4, DUTs 1, 2 and 4 for DUT 5, and DUTs 2 and 3 for DUT 6.

The combination data shown in FIGS. 4 and 5 like this, for example, can be generated by the DUT combination data generation part 114 (See FIG. 2). Further, generated combination data can be stored in the storage unit 113, and can also be displayed on a display or the like by the DUT combination data display part 116 (See FIG. 2) such that the user can recognize this combination data.

In the above-mentioned embodiment, after generating the combination data of FIG. 4 (that is, the combination data for DUTs that can be measured simultaneously expressed for each segment), the combination data of FIG. 5 was generated based on this combination data, but this embodiment is not limited to this. For example, the DUT combination data generation part 114 can directly generate the combination data of FIG. 5 based on at least the connection relationships between the modules 150a through 150d and the DUT 20a through 20f shown in FIG. 3, and only the combination data of FIG. 5 can be displayed by the DUT combination data display part 116. Furthermore, the mode of the combination data display is not limited to the examples shown in FIGS. 4 and 5.

Next, DUT combinations to be actually measured simultaneously are sequentially selected from the DUT combinations shown in FIG. 5, and a plurality of DUTs is tested (Step 105). That is, after taking into account the propriety of measuring all of the plurality of DUTs, the DUT combinations that are to actually be measured simultaneously are sequentially selected based on the DUT combinations of FIG. 5, and a plurality of DUTs is tested in accordance with this sequence.

This step can be carried out by the DUT combination selection part 118 (See FIG. 2). For example, the DUT combination selection part 118 selects the sequence of the DUTs to be measured in accordance with a predetermined rule. As this selection method, for example, there is a method for carrying out selection in the order of numbers pre-allocated to the DUTs (hereinafter, referred to also as selection method (A)), a method for carrying out selection in ascending order from the smallest number of DUT that can be measured simultaneously (hereinafter, referred to also as selection method (B)), and a method for carrying out selection in descending order from the largest number of DUTs that can be measured simultaneously (hereinafter, referred to also as selection method (C)).

The above-mentioned selection methods (A) through (C) are applied to the DUT combinations of FIG. 5 as follows.

When selection method (A) is used, attention focuses on DUT 1 first in accordance with the sequence of the DUT numbers. As shown in FIG. 5, DUTs 3, 4 and 5 can theoretically be measured simultaneously with DUT 1, and attention focuses on DUT 3 in accordance with the sequence of the DUT numbers. As shown in FIG. 5, since DUTs 4 and 5 are not able to be measured simultaneously with DUT 3, it is clear that DUTs 1 and 3 are actually able to be measured simultaneously. Next, attention focuses on DUT 2 in accordance with the sequence of the DUT numbers. As shown in FIG. 5, DUTs 3 and 5 can be measured simultaneously with DUT 2, and since DUT 3 has already been measured, it is clear that DUTs 2 and 5 are actually able to be measured simultaneously. Next, attention focuses on DUT 4 in accordance with the sequence of the DUT numbers. As shown in FIG. 5, DUTs 1 and 5 can theoretically be measured simultaneously with DUT 4, and since DUTs 1 and 5 have already been measured, it is clear that only DUT 4 is actually able to be measured simultaneously. Finally, DUT 6, which is the last DUT remaining, is measured.

When selection method (A) is used like this, DUTs 1 and 3 are measured in the first round of measurements, DUTs 2 and 5 are measured in the second round of measurements, DUT 4 is measured in the third round of measurements, and DUT 6 is measured in the fourth round of measurements. That is, when selection method (A) is used in the connection relationship between the modules and DUTs shown in FIG. 3, all of the DUT can be tested using a total of four measurements.

Next, when selection method (B) is used, attention focuses on DUT 6, which, as is clear from FIG. 5, has the smallest number of DUT that can be measured simultaneously. As shown in FIG. 5, DUTs 2 and 3 can theoretically be measured simultaneously with DUT 6, and since DUTs 2 and 3 can also theoretically be measured simultaneously with one another, it is clear that DUTs 2, 3 and 6 are actually able to be measured simultaneously. Next, since the number of DUTs that are able to be measured simultaneously is the same for all the remaining DUTs 1, 4 and 5, for example, attention focuses on DUT 1. As shown in FIG. 5, DUTs 4 and 5 can theoretically be measured simultaneously with DUT 1, and since DUTs 4 and 5 can also theoretically be measured simultaneously with one another, it is clear that DUTs 1, 4 and 5 are actually able to be measured simultaneously.

When selection method (B) is used like this, DUTs 2, 3 and 6 are measured in the first round of measurements, and DUTs 1, 4 and 5 are measured in the second round of measurements. That is, when selection method (B) is used in the module-DUT connection relationship shown in FIG. 3, all of the DUTs can be tested using two measurements.

Next, when selection method (C) is used, DUTs 1 through 5 have the largest number of DUTs able to be measured simultaneously as is clear from FIG. 5, and, for example, attention focuses on DUT 1. As is shown in FIG. 5, DUTs 4 and 5 can theoretically be measured simultaneously with DUT 1, and since DUTs 4 and 5 can also theoretically be measured simultaneously with one another, it is clear that DUTs 1, 4 and 5 are actually able to be measured simultaneously. Next, of the remaining DUTs 2, 3 and 6, DUTs 2 and 3 have the largest number of DUTs that can be measured simultaneously, and, for example, attention focuses on DUT 2. As is shown in FIG. 5, DUTs 3, 5 and 6 can theoretically be measured simultaneously with DUT 2, and since DUT 5 has already been measured and DUTs 3 and 6 can be measured simultaneously with one another, it is clear that DUTs 2, 3 and 6 are actually able to be measured simultaneously.

When selection method (C) is used like this, DUTs 1, 4 and 5 are measured in the first round of measurements, and DUT 2, 3 and 6 are measured in the second round of measurements. That is, when selection method (C) is used in the module-DUT connection relationship shown in FIG. 3, all of the DUTs can be tested using two measurements.

As described above, it is clear that selection methods (B) and (C) use two times fewer the number of measurements than selection method (A) in the module-DUT connection relationship shown in FIG. 3. For example, the DUT combination selection part 118 sequentially selects the respective DUT combinations to be actually measured simultaneously based on the above-mentioned selection methods (A) through (C), and the selection method in which there are minimal number of measurements can be selected from these selection methods. Or, the number of measurements when using selection methods (A) through (C) can be stored in advance in the storage unit 113 for each multiple module-DUT connection relationship, the selection method that constitutes the least number of measurements can be predetermined from the data stored in the storage unit 113, and this selection method can be executed.

According to this embodiment, even when a user arbitrarily connects a module and a DUT, in particular, even when two or more DUTs are connected to a single module, a plurality of DUTs can be efficiently tested using the least number of measurements possible. That is, the number of DUTs that are able to be tested in a one-time module-DUT connection can be increased as much as possible, and the testing time per one-time connection can be shortened.

Further, finding a solution to the DUT measurement sequence such that there are theoretically a minimum number of measurements either becomes impossible or takes a very long time when a large number of DUTs is connected to the test module, but the testing method related to this embodiment makes it possible to effectively reduce the number of measurements despite the fact that it is easy and takes relatively little time to calculate the DUT measurement sequence (combinations). Accordingly, DUT test preparation time and actual testing time can be greatly reduced.

Furthermore, in the above-mentioned constitution example of FIG. 3, the example of the test module 150 presented is one in which the module has segments 150*a*-1 through 150*d*-1, a plurality of external terminals 152 is allocated to each segment, and only one external terminal 22 of a DUT can be connected to one external terminal 152, but the configuration of the test module 150 is not limited to this. For example, the test module 150 can also have an external terminal as a segment, which is the smallest operating unit. In this case, the test module 150 can have a plurality of external terminals (in broad terms, a "segment"), and two or more external terminals of either the same or different DUTs can share a single external terminal. That is, this embodiment can be applied to a "resource sharing" configuration in which a test module external terminal or the external terminal circuitry mounted on a load board is shared by the plurality of external terminals of a DUT.

The working examples and applications explained using the above-described embodiment of the invention can be utilized by either arbitrarily combining or making changes or improvement to same in accordance with the use, and the present invention is not limited to the disclosure of the above-described embodiment. It is clear from the disclosure of the Claims that a configuration that adds either a combination, or change or improvement like this can also be included within the technical scope of the present invention.

What is claimed is:

1. A testing method for testing a plurality of devices under test, by using a DUT selection control device which is configured to select prescribed combinations from multiple combinations of the connection between the plurality of devices and a test module, based on the prescribed combinations, comprising:
   (a) at the DUT selection control device, acquiring information about the connection relationship between the test module and the plurality of devices under test, and, based on at least the information, generating a first combination data of devices under test that can theoretically be measured simultaneously from among the combinations of the plurality of devices under test; and
   (b) sequentially selecting the combinations of the plurality of devices under test to be actually measured simultaneously from the first combination data by using the DUT selection control device, and testing the plurality of devices under test in accordance with the sequence, wherein the combinations of devices under test to be actually measured simultaneously are selected in (b) in ascending order from the smallest number of devices under test that can be measured simultaneously.

2. The testing method according to claim 1, wherein, by carrying out (a) and (b), testing is performed with a number of measurements that is less than the number of the plurality of devices under test connected to the test module.

3. The testing method according to claim 1, wherein the test module has a plurality of segments, and the step (a) comprising:
   at the DUT selection control device, determining a second combination data of devices under test that are unable to be measured simultaneously for each one of the plurality of segments from the information about the connection relationship between the test module and the plurality of devices under test; and
   generating the first combination data based on the second combination data.

4. A non-transitory computer readable medium storing a program for causing a computer to execute the testing method of claim 1.

* * * * *